(12) United States Patent
Krusor et al.

(10) Patent No.: US 10,349,528 B2
(45) Date of Patent: Jul. 9, 2019

(54) SPRING LOADED ROLLERBALL PEN FOR DEPOSITION OF MATERIALS ON RAISED SURFACES

(71) Applicant: Palo Alto Research Center Incorporated, Palo Alto, CA (US)

(72) Inventors: Brent S. Krusor, Fremont, CA (US); Ping Mei, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 3 days.

(21) Appl. No.: 15/438,241

(22) Filed: Feb. 21, 2017

(65) Prior Publication Data

US 2018/0236480 A1    Aug. 23, 2018

(51) Int. Cl.
| | |
|---|---|
| *B05C 11/10* | (2006.01) |
| *H05K 3/12* | (2006.01) |
| *B05C 1/08* | (2006.01) |
| *B43K 7/00* | (2006.01) |
| *B05C 1/02* | (2006.01) |

(52) U.S. Cl.
CPC ........... *H05K 3/1275* (2013.01); *B05C 1/027* (2013.01); *B05C 1/08* (2013.01); *B05C 1/0813* (2013.01); *B05C 11/1021* (2013.01); *B43K 7/00* (2013.01)

(58) Field of Classification Search
CPC .................................................. B05C 1/0843
USPC ......................................................... 401/209
See application file for complete search history.

(56) References Cited

U.S. PATENT DOCUMENTS

| | | | | | |
|---|---|---|---|---|---|
| 4,743,465 | A | * | 5/1988 | Saeki | .................... H01L 21/705 118/302 |
| 5,899,618 | A | * | 5/1999 | Kobayashi | ............. B43K 1/086 401/29 |
| 8,973,521 | B2 | * | 3/2015 | Vogt | ........................ A61L 27/54 118/264 |
| 2006/0188321 | A1 | * | 8/2006 | Nakamura | ............... B43K 1/08 401/214 |
| 2007/0253761 | A1 | * | 11/2007 | May | .................... B29C 45/0046 401/133 |
| 2008/0003052 | A1 | * | 1/2008 | Lee | ...................... A45D 34/041 401/209 |
| 2010/0024733 | A1 | * | 2/2010 | Soda | .................... C03C 17/001 118/730 |
| 2010/0179475 | A1 | * | 7/2010 | Hoffmann | ............... A61L 29/16 604/103.02 |

(Continued)

OTHER PUBLICATIONS

Zheng, et al. "Pervasive Liquid Metal Direct Writing Electronics with Roller-ball Pen", Beijing Key Lab of CryoBiomedical Eng. and Key Lab of Cryogenics, Technical Inst. of Physics and Chemistry, Chinese Academy of Sciences, Beijing 100190 China; & Dept. of Biomedical Engineering, School of Medicine, Tsinghua University, Beijing 1000084, China—7pgs (online version https://doi.org/10.1063/1.4832220—published Nov. 19, 2013—7 pgs.

(Continued)

*Primary Examiner* — Karl Kurple
(74) *Attorney, Agent, or Firm* — Fay Sharpe LLP

(57) ABSTRACT

A material deposition system and method is disclosed for depositing material onto raised features on a surface of a substrate. The material deposition system and method are a contact deposition or printing system and method, which employs biased rollerball to deposit the material as it travels along the substrate and over the raised features.

18 Claims, 9 Drawing Sheets

(56) References Cited

U.S. PATENT DOCUMENTS

| | | | | |
|---|---|---|---|---|
| 2016/0014906 A1* | 1/2016 | Ilic | ............................ | H05K 3/12 |
| | | | | 427/98.4 |
| 2016/0152073 A1* | 6/2016 | Wang | .................. | B60B 33/0002 |
| | | | | 228/122.1 |
| 2018/0272379 A1* | 9/2018 | Skinner | ............. | B05C 17/00526 |

OTHER PUBLICATIONS https://news.illinois.edu/blog/view/6367/205292, "Silver Pen has the Write Stuff for Flexible Electronics", Jun. 28, 2011 (7 pgs).
http:/discovermagazine.com/2014/oct/23-circuit-pen-draws-up-possibilites, "Circuit Pen Draws Up Possibilities", DiscoverMagazine.com. Aug, 28, 2014 (2 pgs).
https://shop.circuitscribe.com/collections/conductive-ink-pens-accessories, Circuit Scribe Official Store accessed Nov. 14, 2017 (w/related links—18 pages).
https://www.reuters.com/video/2016/07/21/japanses-pen-draws-circuits-with-conduct?videoId=369340584 "Japanese Pen Draws Circuits with Conductive Ink", Reuters.com Jul. 21, 2016 (3 pages).

\* cited by examiner

SPRING LOADED ROLLERBALL PEN FOR DEPOSITION OF MATERIALS ON RAISED SURFACES

BACKGROUND

Inkjet and extrusion printing are commonly used to deposit conductive and dielectric traces on substrates, such as but not limited to polymer substrates. This printing can be undertaken in a variety of areas including but not being limited to flexible electronic applications. Both inkjet printing and extrusion printing are close proximity, non-contact printing techniques and can be used to print on planar substrates. However, increasingly electronic circuits and other devices or components are incorporating raised features including but not limited to discrete components, biomaterials and 3D printed structures. In order to print on these and other raised features using either inkjet or extrusion printing it is necessary that an associated ejection tip or print head be in close and consistent proximity to the surface of the substrate or elements on which the inkjet printing or extrusion printing is to occur. As one attempts to print onto features raised above the surface plane of the substrate the ejection tip or print head must be continuously adjusted to follow the surface features. This requires an optical or other sensing and data feedback system to obtain an overview of the layout on the surface substrate. The obtained data is then used to perform complex planning by the relevant non-contact inkjet and/or extrusion printing systems, in order to traverse ejection tip or print head across the raised surface in a proper manner.

BRIEF DESCRIPTION

A material deposition system for depositing material onto raised surfaces on a substrate is set forth. The system comprises a material deposition assembly including, a rollerball, a housing component configured to hold the rollerball, the housing component having an inner surface, an outer surface, a first end, and a second end distant from the first end. The first end is sized and configured to hold the rollerball while allowing the rollerball to rotate. A bias mechanism is positioned to contact the second end of the housing component. A stationary fitting having an inner surface and outer surface, where the inner surface is in contact with at least a portion of the outer surface of the housing component. A material carrying tube arrangement is configured to carry material to be deposited, the material carrying tube arrangement having a first opening arranged to receive the material to be deposited on the surface of the substrate, and a second end positioned immediately substantially adjacent a portion of the rollerball. A material container is configured to hold the material to be deposited, and positioned to provide the material to be deposited to the material carrying tube arrangement. A carriage arrangement is configured to hold and move the material deposition assembly.

Another aspect is that the inner surface of the stationary fitting has a low coefficient of friction to allow smooth sliding of the outer surface of the housing component against the inner surface of the stationary fitting.

Another aspect includes an air pressure generator positioned and configured to generate air pressure to move the material to be deposited through the material carrying tube arrangement and out over the rollerball.

Another aspect includes having the bias mechanism come into contact with the housing component only at the second end of the housing component.

Another aspect includes a surface location indicator configured to determine a distance between the material deposition assembly and the surface of the substrate on which the material is to be deposited.

Another aspect includes the stationary fitting being made of a substance having a coefficient of friction of approximately between 0.1 and 0.2.

Another aspect includes the stationary fitting or bushing is made of at least one of a low surface energy polymer or graphalloy.

Another aspect includes the material to be deposited is a non-Newtonian fluid which does not flow out of the material deposition assembly until movement of the rollerball which causes a sheer stress lowering the viscosity of the material which permits the material to flow.

Another aspect includes the air pressure generator configured to provide air pressure in a range of 20 psi to 40 psi.

Another aspect includes the material deposition system configured to deposit material from the rollerball end over printed electronics as part of 3D printing.

Another aspect includes a material sensor positioned and configured to sense a presence of a raised feature on the surface of the substrate, while the rollerball is in contact with the surface.

Further set forth is a method for depositing material on a surface of a substrate having a raised feature by use of a material deposition system. The method includes providing a material deposition system configured to deposit a material on a surface of a substrate, with the surface having at least one raised feature. The method also includes moving the material deposition system into contact with the surface of the substrate by bringing a rollerball of the material deposition system into contact with the surface of the substrate; moving the material deposition system which is in contact with the surface of the substrate while depositing the material onto the surface of the substrate, wherein the moving causes the material deposition system to encounter the at least one raised feature, the raised feature provided to the substrate prior to operation of the material deposition; moving the material deposition system up onto and over the raised feature, while depositing the material from the rollerball end of the material deposition system, and wherein the deposited material from the rollerball end of the material deposition system forms a unbroken trace of the material on the substrate surface and the raised feature.

Another aspect of the method includes sensing by a sensor that the encountered raised feature on the surface of the substrate includes an incident slope or angle wherein a portion of the rollerball will not be able to contact a portion of the surface of the substrate due to a depth of the incident slope or angle of the raised feature, and based on the sensed information, the method will increase an amount of the material coming from the rollerball end of the material deposition assembly during a time the rollerball is in an area of the incident slop or angle to provide a sufficient amount of the material to maintain an unbroken line of the material.

Another aspect of the method increases the amount of material coming from the rollerball end by increasing an amount of air pressure supplied from the air pressure generator.

Another aspect of the method upon encountering the raised feature on the surface of the substrate generates an upward force to the housing component causing a sliding action between the outer surface of the housing component and the inner surface of the stationary fitting while maintaining the rollerball in contact with the surface of the substrate, by action of a bias mechanism.

Another aspect of the method includes providing filler material to the incident slope or angle of the raised feature on the surface of the substrate prior to moving the rollerball of the material deposition assembly over the raised feature.

DETAILED DESCRIPTION

Figure 1:
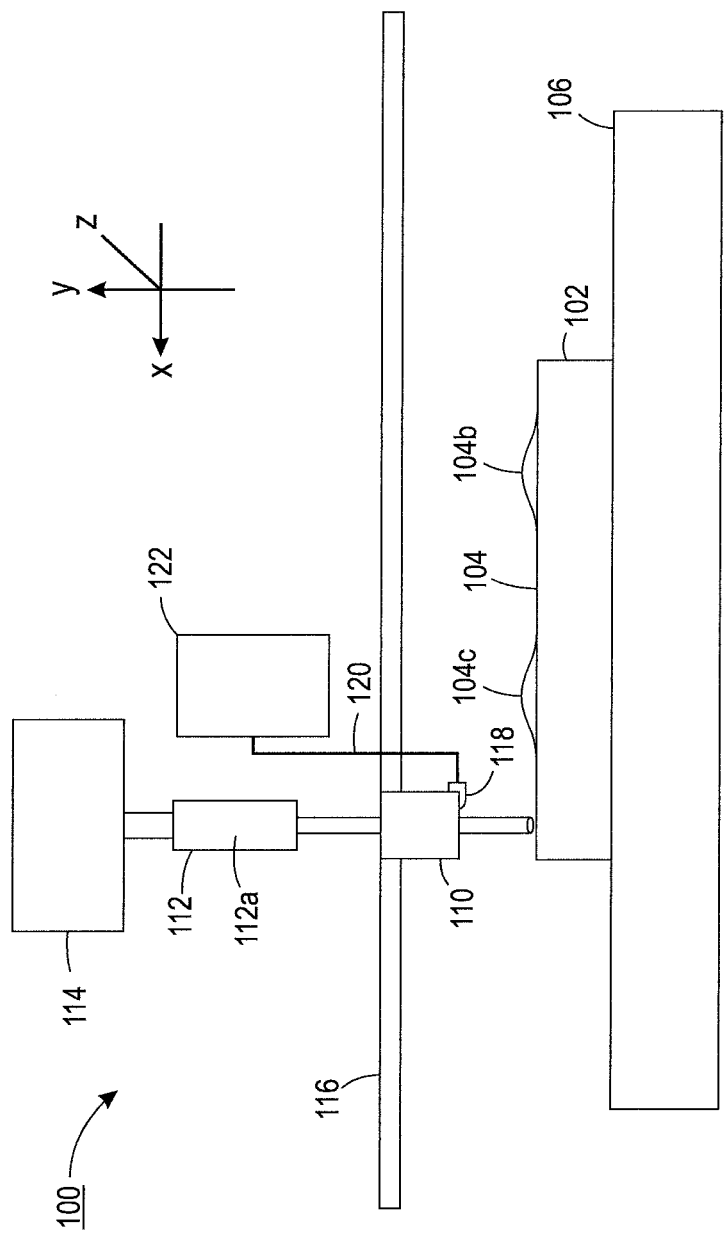
FIG. 1 is a side view of a material deposition system for depositing material onto raised surfaces located on a substrate.

FIG. 1 discloses a contact deposition or printing system 100 for contact printing or contact deposition of a material onto a substrate 102 having a surface 104 with 3-dimensional topography which includes a trace 104a having (raised features or portions) 104b, and where the substrate 102 is carried on a carrier plate 106. The traces are in certain embodiments conductive traces and/or dielectric traces.

Among other elements system 100 is configured to include a material deposition assembly or rollerball pen configuration 110, a material container or reservoir 112 (holding material 112a to be deposited), an air pressure generator or compressor 114, a carriage assembly (e.g., carriage and frame arrangement) 116, and a surface location indicator 118 which determines a distance the material deposition assembly 110 is from surface 104 of substrate 102.

In an embodiment the data obtained by indicator 118 is provided via a feedback line 120 to a controller 122 which operates to bring the material deposition assembly 110 into contact with the surface 104, and to thereafter control deposition operations of the hardware of system 100. The feedback line 120 and/or other communication lines may be implemented in a wired and/or wireless arrangement.

The controller 122 is configured to be implemented as any of a wide range of computing devices, and in certain embodiments includes an input/output interface, memory, and processing units, allowing it to store and run software instructions. The controller 122 may be integrated into the system 100 and/or is separate from the system 100 with a communication link thereto. In other embodiments the indicator 118 is manually operated without the need of the automated feedback concepts.

It is to be understood indicator 118, feedback line 120, and controller 122 arrangement is directed to finding the distance between the surface 104 and the assembly 110 and is not, even when an optical reader is the indicator, being used as in the non-contact printing or extrusion systems to obtain layout information of the surface prior to printing, such as previously described. Particularly, as the present disclosure teaches a system 100 which is in contact with the surface, it is not concerned with maintaining a distance between the depositing device and the surface during the depositing operations.

With continuing attention to FIG. 1, carrier plate 106 is either stationary or movable. When moveable the carrier plate 106 is motorized and includes gearing and other appropriate mechanical components to allow it to move in multiple directions such as in the x, y, and z-directions. Similarly, carriage (e.g., a carriage and frame arrangement) 116 is either stationary or movable, and when moveable is motorized and includes gearing and other appropriate mechanical components to allow it to move in multiple directions such as the x, y, and z-directions. Therefore, in certain embodiments the carriage 116 is stationary, and the carrier plate 106 moves the substrate 102. In other embodiments the carrier plate 106 is stationary, and the carriage 116 is configured to be movable in the x, y, and z-directions. Still further, certain embodiments may have both the carrier plate 106 and the carriage 116 movable and are controlled to operate cooperatively. In still other embodiments the carriage 116 holds material deposition assembly 110 and it is the material deposition assembly 110 which may move along the carriage 116 such as in a metal track or other known arrangement.

It is also to be understood the other components such as the material container or reservoir 112 and air pressure generator or compressor 114 may be moved with the material deposition assembly 110, and/or may include flexible tubing and other connections that allow them to be stationary within the confines of the system 100. These and other arrangements are understood to be included in the concepts of FIG. 1.

Figure 2A:
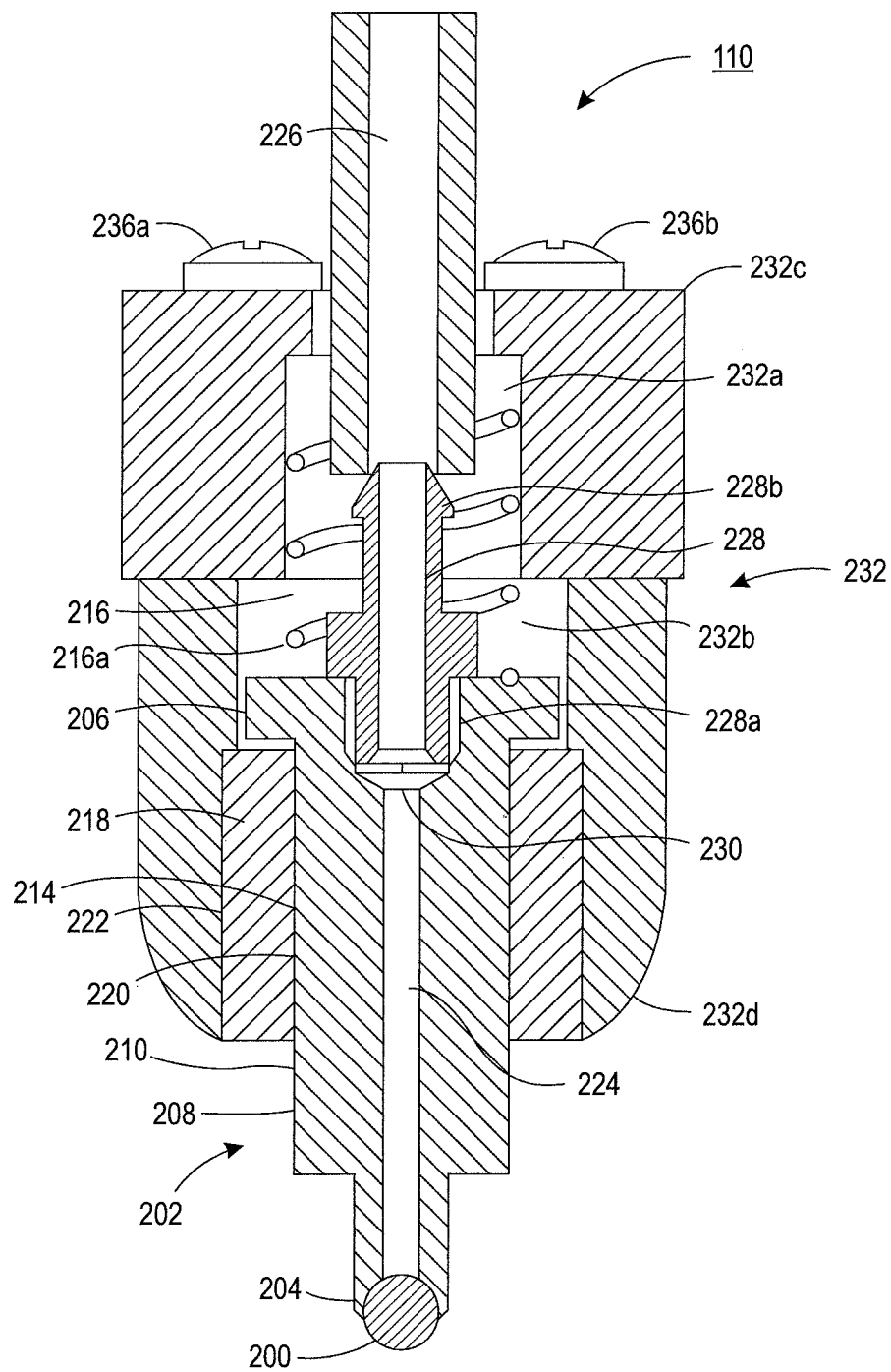
FIG. 2A is a cutaway view of a material deposition assembly of the system shown in FIG. 1.

Turning to FIG. 2A, illustrated is a side cutaway view of the material deposition assembly 110 of FIG. 1. Shown are a rollerball 200 and a housing component 202. The housing component 202 includes a first end 204 which is sized and configured to hold the rollerball 200, while at the same time allowing the rollerball 200 to rotate. In certain embodiments the housing component 202 is designed to have a swaged tip to hold the ball against a curved inner surface. However, it understood that other designs that hold the rollerball while allowing it to rotate may also be used. The housing component 202 further includes a second end 206 which is distant from the first end 204. In certain embodiments such as shown in FIG. 2A, the second end 206 is understood to be of a T-shape or other extended end shape. The housing component 202 is also understood to have an inner surface 208 and an outer surface 210 as well as a channel 214.

A bias mechanism such as in the form of a spring or other appropriate element 216 is positioned with a lower end 216a which in operation comes into contact and presses against a portion of the second end 206 of housing component 202. Other forms of bias mechanisms include but are not limited to compressed gas, and memory foam type materials.

A stationary fitting (or bushing) 218 includes an inner surface 220 and an outer surface 222. The inner surface 220 of stationary fitting 218 is in contact with at least a portion of the outer surface 210 of housing component 202. The stationary fitting 218 is made such that at least the inner surface 220 has a low coefficient of friction. In certain embodiments the coefficient of friction is in a range of approximately 0.1 to 0.2, which allows a smooth sliding of the outer surface 210 of the housing component 202 against the inner surface 220 of the stationary fitting 218. The stationary fitting is formed from but not limited to low surface energy polymers (e.g., fluoropolymers), graphalloys (e.g., an alloy of graphite and another metal(s), bronze, copper, iron, silver, among others), as well as other materials when extrinsic lubrication is used.

Also included as part of system 100 is a material carrying tube configuration which includes a lower tube portion 224, an upper tube portion 226, and a tube interface portion 228. The lower tube portion 224 is within a channel 214 of the housing component 202. The interface portion 228 includes a threaded end 228a which matches into a threaded portion 230 of the second end 206 of housing component 202. An upper end of the interface element 228 includes a barbed end 228b over which the lower portion of upper tube 226 is fitted. For convenience of viewing, in FIG. 2A a bottom end 226a of upper tube portion 226 is shown in a state where it has not yet engaged the barbed end 228b.

It is noted the upper tube portion 226 receives the material 112a to be deposited from the material container or reservoir 112, where the material 112a is moved through the tube arrangement (224, 226, 228) by air pressure from the air pressure generator or compressor 114, such as shown by FIG. 1. The material 112a may be a variety of substances, including but not limited to a non-newtonian fluid which is maintained (i.e., does not flow out) within the material deposition assembly 110 (e.g., at rollerball 200) until movement (e.g., rolling) of the rollerball 200 which causes a sheer stress that lowers the viscosity of the material 112a permitting the material to flow. It is to be understood that while the present disclosure identifies an air pressure generator as the device used to move the material through the systems described herein, any other device that is capable of moving the material through the system may also be employed.

With continuing attention to FIG. 2A, also disclosed is a body portion 232 configured to hold or enclose various elements which have been discussed herein. The body portion includes an upper interior area 232a and a lower interior area 232b. The body portion 232 is also understood in this embodiment to be made of an upper portion 232c and a lower portion 232d, which are brought together by holding mechanisms 236a, 236b, such as in the form of screws or other appropriate arrangement.

As can also be seen in connection with FIG. 2A, in addition to the bias mechanism 216 being positioned with lower end 216a arranged to come into contact with a portion of the second end 206 of housing component 202, bias mechanism 216 is also positioned such that an upper end 216b of bias mechanism 216 will come into contact with a surface of upper interior area 232a during operation of the system 100. Further, second end 206 of housing component 202 is constrained in its movement between an upper surface of the stationary fitting 218 and a lower surface of the upper portion 232c. The stationary fitting is at least in part held in place by a ledge area of the lower portion 232d.

Figure 2B:
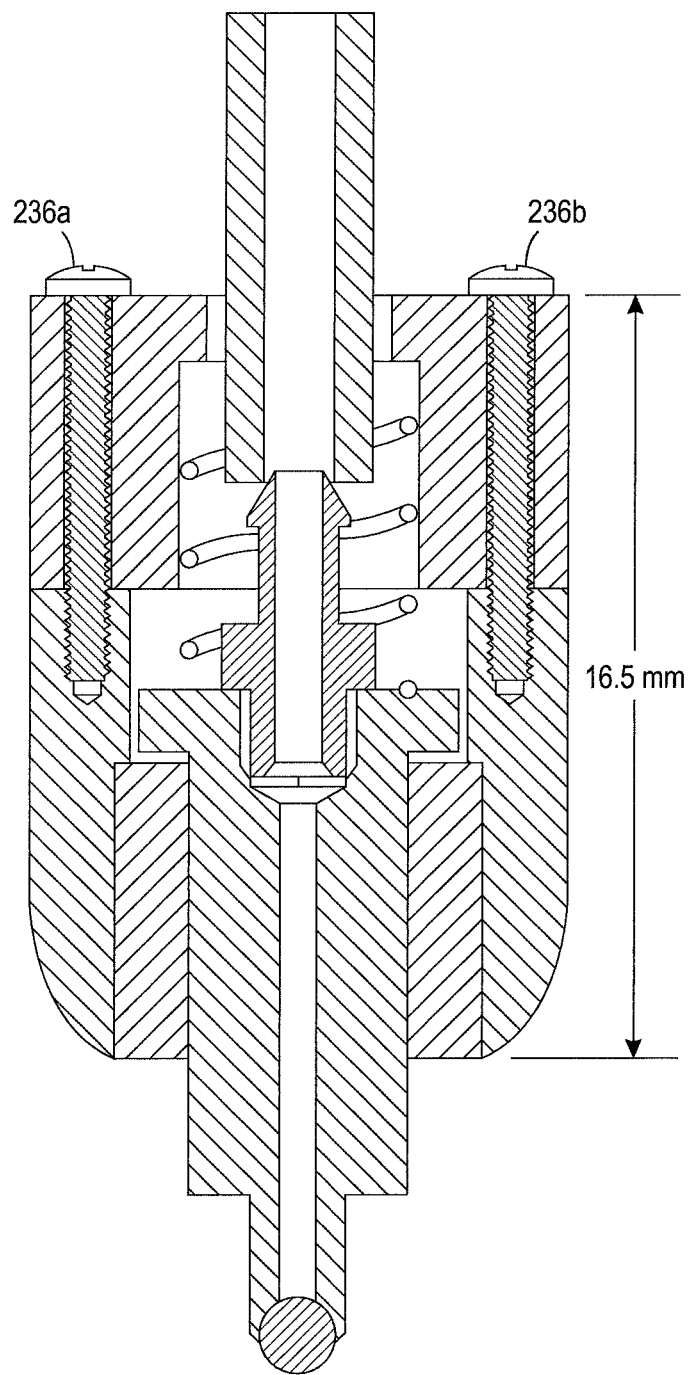
FIG. 2B is an alternative view of the material deposition assembly.

Turning to FIG. 2B, the elements shown there are substantially identical to those of the present FIG. 2A, however the screw connections are shown in more detail.

In consideration of FIGS. 1, 2A, 2B, the material deposition assembly 110, has the rollerball 200 in contact with the surface of the substrate 102 on which material 112a is being deposited. As the material deposition assembly 110 comes into contact with surface 104, pressure is applied to the rollerball 200, causing compression of the bias (spring) mechanism 216 whereby the housing component 202 slides up against the stationary fitting 218. As the rollerball 200 is rotated, the fluidized material 112a delivered from the tube arrangement (224, 226, 228) moves out of the lower end 204 and onto the surface 104 of substrate 102. By this arrangement, as the material deposition assembly 110 is moved across surface 104 a line or trace is deposited or printed, including over raised feature or portion 104b. Particularly, when such raised features or portions 104b are encountered the housing component 202 is moved upwards raising the rollerball 200 to allow the rollerball 202 to follow the contour of the raised features or portions 104b such that a substantially continuous line or trace of material 112a is deposited onto the raised features or portions 104b.

The above is accomplished without the need of having an overview and understanding of the topology of a particular surface prior to operation. As such there is no need for an optical device (e.g., camera) to feedback collected data regarding the surface topology to complex algorithms, in order to adjust a height of a print head in accordance with the changing topology of the surface, such as necessary in non-contact printing systems. This concept will be shown in more detail with regard to the following disclosure.

Figure 3:
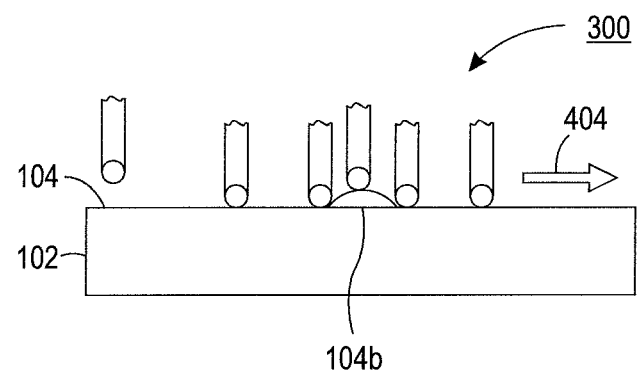
FIG. 3 is a partial side view of the operation of the material deposition assembly traversing a non-planar or three-dimensional surface of a substrate.
Figure 4:
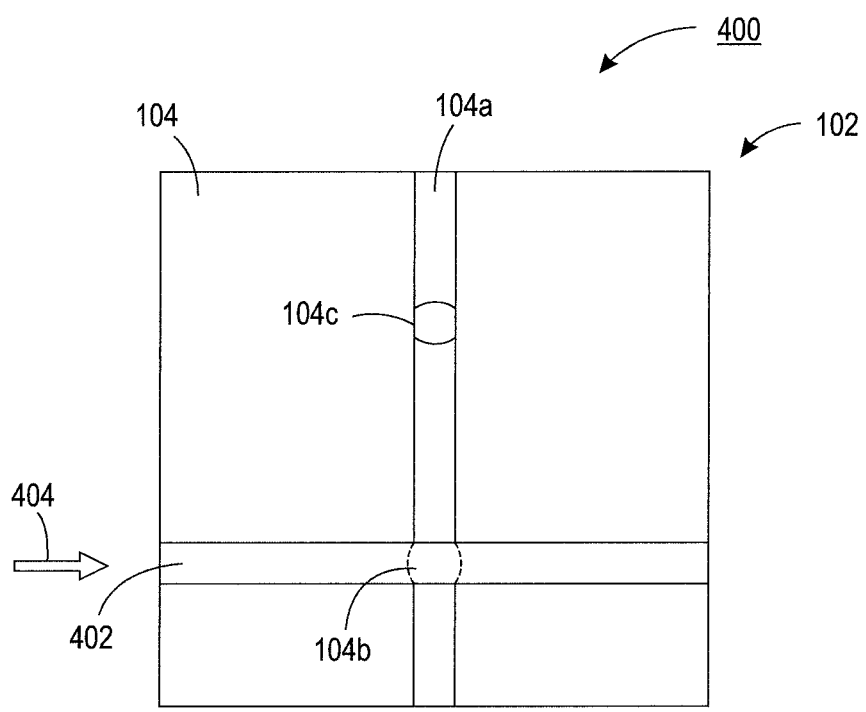
FIG. 4 is a top view of deposition or printing which has occurred in connection with FIG. 3.

Turning to FIGS. 3 and 4, illustrated in FIG. 3 is a side view 300 showing progressive operational steps of a contact printing or contact deposition system 100 such as shown in FIG. 1 and illustrated in FIG. 4 is a top view of a surface following the operations depicted in FIG. 3. Prior to the operational steps of FIG. 3, the surface 104 has had already deposited thereon trace 104a, having raised features or portions 104b, 104c shown more clearly in FIG. 4. It is noted the operational steps of FIG. 3 are in a direction perpendicular to trace 104a.

For simplicity, in FIG. 3 only the bottom portion of the system 100 is shown, which includes the rollerball 200 and a portion of the housing component 202. At a first time in operation of the system 100, the rollerball 200 is located above surface 104 of substrate 102 where the surface has the previously deposited trace 104a with a three-dimensional topology, e.g., having the raised features of portions 104b, 104c. In accordance with the discussion concerning the contact deposition (or printing) system 100, the rollerball 200 is moved into contact with surface 104, and system 100 is then moved forward depositing material 112a from lower end 204 of housing component 202. As the rollerball 200 of system 100 encounters the beginning of one of the raised feature(s) or portion(s) 104b the system 100 continues to progress.

Again these operations or steps take place without the need of having an understanding of the overall topology of the surface 104 during or prior to operation, such as by use of video data. Rather, system 100 moves forward and the compression of the bias mechanism 216 and the sliding against the stationary fitting 218 previously mentioned takes place to allow the rollerball 200 to stay in contact with the surface 104 as the system 100 traverses the raised feature or portion 104b.

Then as the system 100 is moved along a backside of the raised feature of portion 104b the bias mechanism 216 decompresses allowing the housing component 202 to slide towards the surface 104, maintaining the rollerball 200 in contact with the surface 104 (3-O) until it is again traversing a planar portion of surface 104. Throughout the operation rollerball 200 is substantially maintained in contact with the surface 104 and/or raised feature or portion 104b allowing for the formation of an unbroken trace or line of material 112a to be deposited.

Turning to the top view 400 of FIG. 4, shown is surface 104 of substrate 102, with previously deposited trace 104a having raised features or portions 104b, 104c. By operations discussed in connection with FIG. 3, a trace 402 of material 112a, perpendicular to trace 104a, has been deposit in the direction indicated by arrow 404. As can be seen, trace or line 402 crosses over raised feature or portions 104b (but not in this example 104c) while also continuing to deposit material on the surface 104 to form an unbroken trace or line 402. Raised feature or portion 104b is depicted in dotted lines in FIG. 4 to indicate the raised feature or portion 104b has been covered by the material 112a of trace 402.

Figure 5:
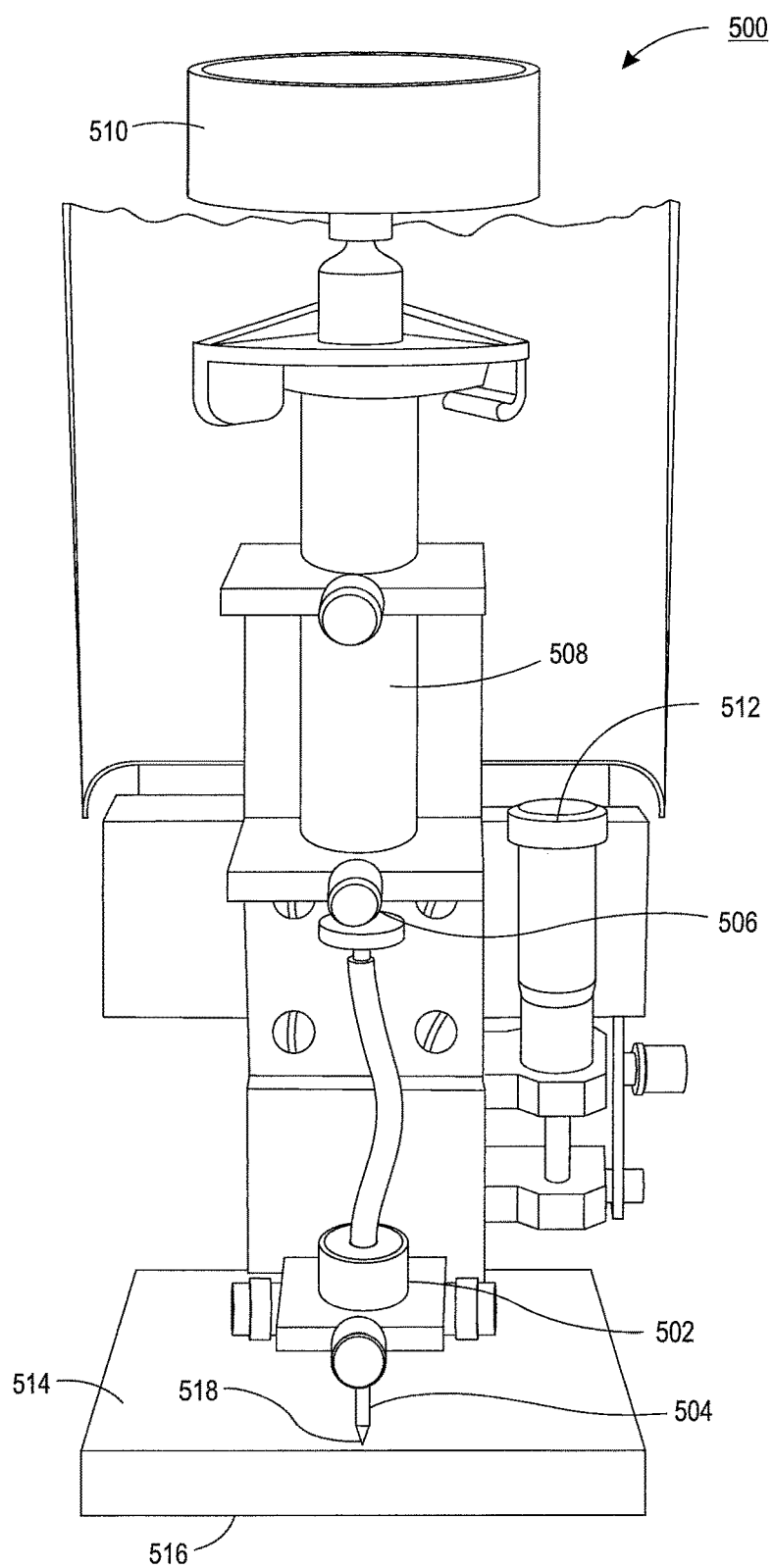
FIG. 5 is an illustration of another embodiment for a material deposition system according to the present teachings.

Turning to FIG. 5, illustrated is another embodiment of a material deposition system 500 according to the present teachings. In this embodiment, the structure includes a housing component 502, similar to housing component 202 of FIG. 2A, where the lower end 504 of housing component 502, is tapered end to hold a rollerball. The housing component 502 of system 100 allows for operation similar to that previously discussed. In this embodiment, the material carrying tube configuration 506 illustrates the tubes (such as used in the system 100 of FIG. 1) may be very flexible to allow for movement. A material container or reservoir 508 is shown connected in between the material carrying tube configuration 508 and an air pressure generator or compressor 510. Also illustrated in FIG. 5 is a surface location indicator which is in the form of a micrometer system 512, where the micrometer system 512 may manually be moved to the surface 514 of substrate 516 to determine the distance rollerball 518 is from the surface 514 and to then use this information to bring the rollerball 518 into contact with the surface 514. The system 500 of FIG. 5 is also understood to include a controller arrangement as discussed in connection with FIG. 1 (e.g., 120, 122).

Figure 6:
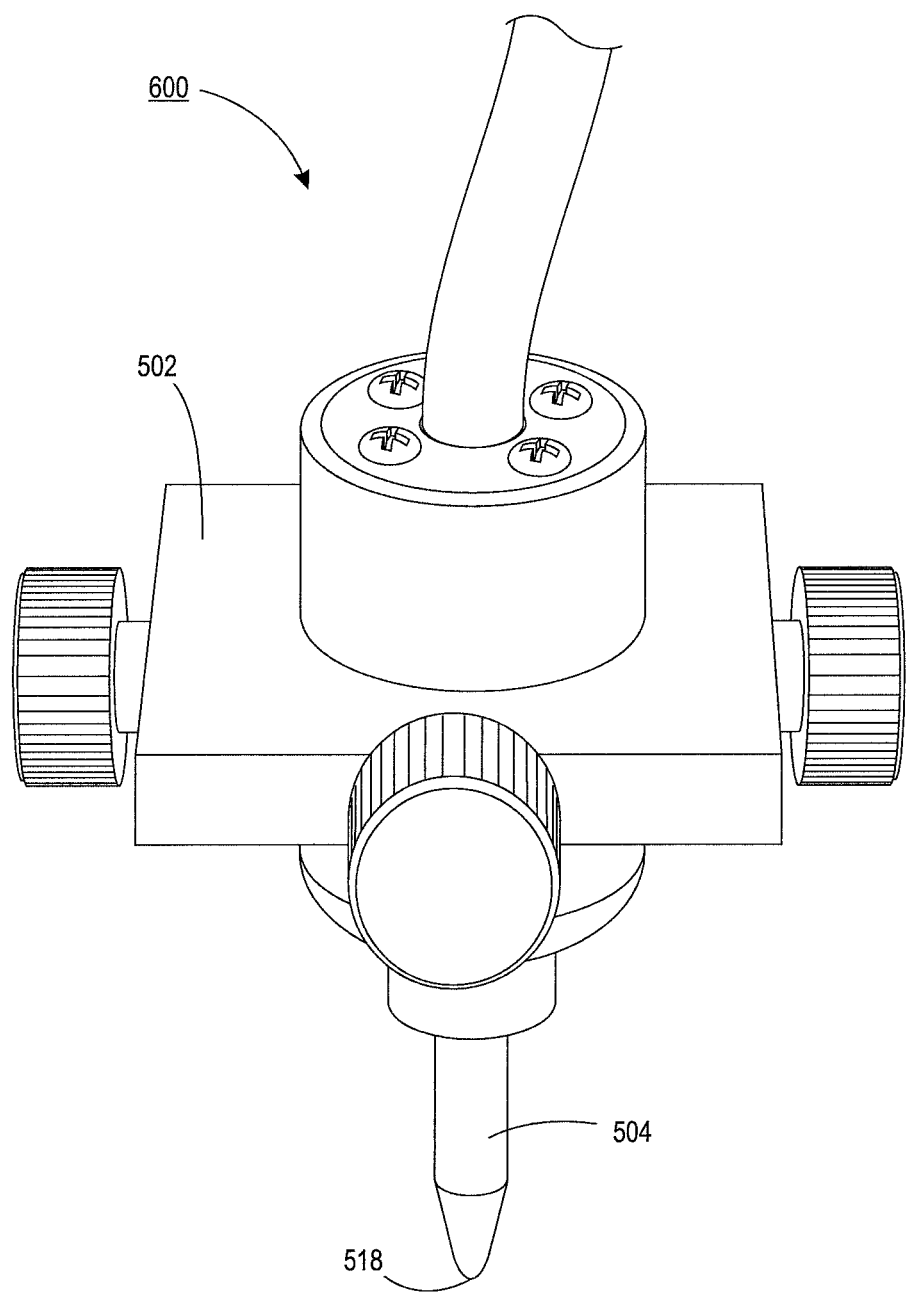
FIG. 6 provides a more detailed view of a material deposition assembly of the system shown in FIG. 5.

With attention to FIG. 6 housing component 502 is shown in more detail where the lower end 504 of housing component 502 is tapered. This design decreases the structure around the rollerball 518.

Figure 7:
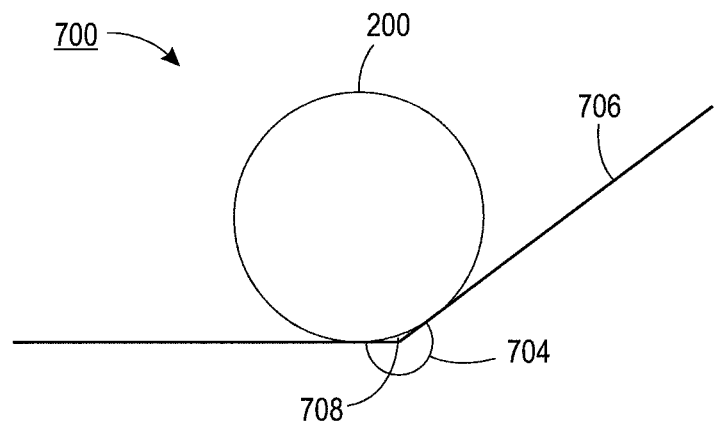
FIG. 7 illustrates a point between a flat surface and an incident slope or angle of a raised feature to be traversed by a rollerball used in the present disclosure.

Turning to illustration 700 of FIG. 7, depicted is a rollerball 702 coming into contact with an angle (or incident slope) 704 of a raised feature or portion 706. As can be seen, there is a gap area 708 where the rollerball 702 does not make direct contact. In a situation such as shown in FIG. 7 a system according to the present disclosure (e.g., such as system 100 of FIG. 1 or system 500 of FIG. 5), is operated to increase the air pressure which supplies more material 112a to insure that there is a complete unbroken trace or line being formed. The increased air pressure will in turn increase the flow of material 112a being deposited at this location to fill-in the gap area 708.

Figure 8:
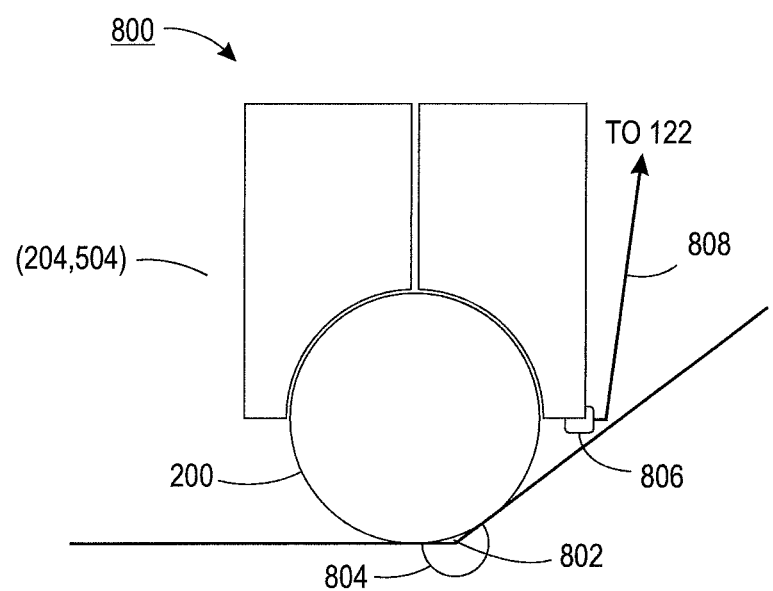
FIG. 8 depicts an incident slope or angle of a raised feature similar to FIG. 7, along with a portion of the housing holding the rollerball.

This gap area issue can occur due to the size or diameter of the rollerball 200, and may also occur due to the structure of the lower end (e.g., 204, 504) of the housing component (e.g., 202, 502) as shown in illustration 800 by gap area 802 of FIG. 8. In one embodiment this gap area issue is addressed by inclusion of a raised feature or portion sensor 806 with a feedback line (wired or wireless) 808 to controller 122. In this design, sensor 806 signals the presence of an angle (or incident slope) 804, and this information is used by the controller 122 to appropriately increase the output of the air pressure device 114 and/or the speed at which the system 100 (500) advances, which in turn deposits additional material 112a into the gap areas 708, 802.

Figure 9:
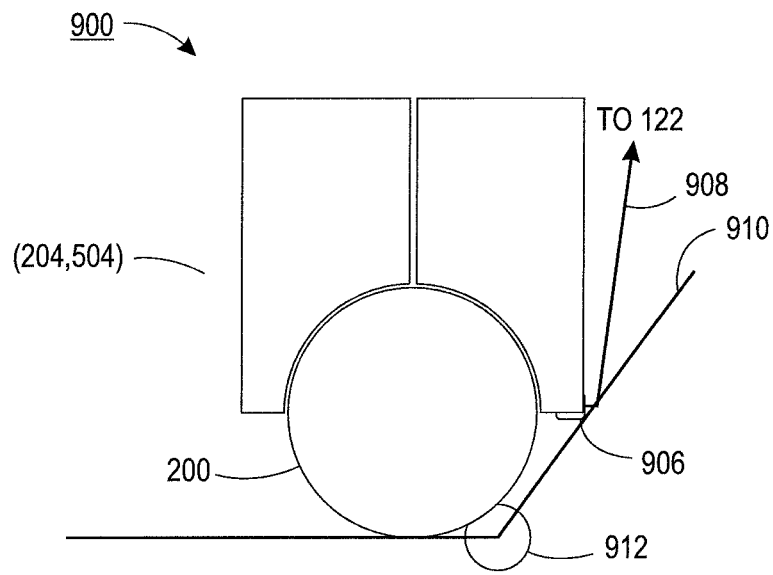
FIG. 9 illustrates another depiction of an incident slope or angle of a raised feature and the rollerball and housing configuration according to the present disclosure.
Figure 10:
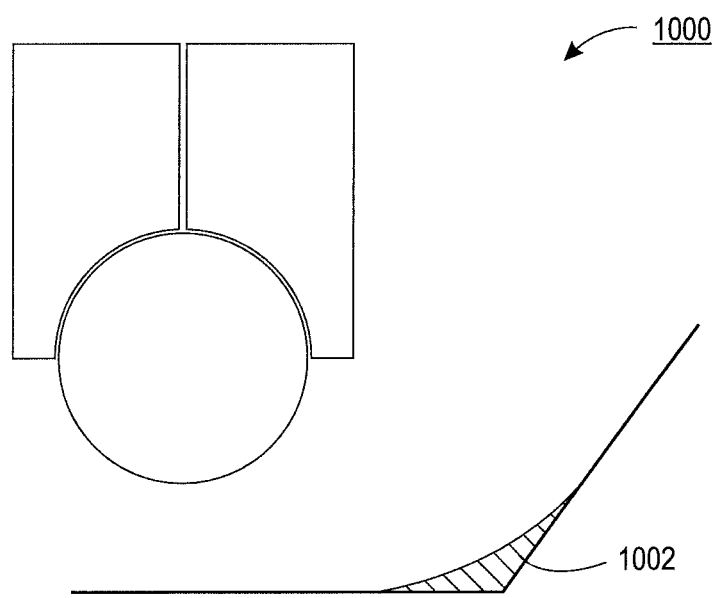
FIG. 10 depicts the illustration of FIG. 9 with a filler material positioned within the incident slope or angle area.

Illustration 900 of FIG. 9 depicts a rollerball 200 and lower portion of a housing component (204, 504), with a raised feature or portion sensor 906 and feedback line 908 to controller 122, positioned near a raised feature or portion 910, with a more severe angle (or incident slope) 912 than FIGS. 7 and 8. Such more severe angles (or incident slopes) may be addressed in a manner similar to that discussed in connection with FIG. 8. In addition and as shown by illustration 1000 of FIG. 10, this situation may also be addressed by prefilling the gap area 1002 prior to the trace or line forming operations previously described such that pre-filling acts to even out the angle area to allow the generation of an unbroken complete trace or line.

Figure 11:
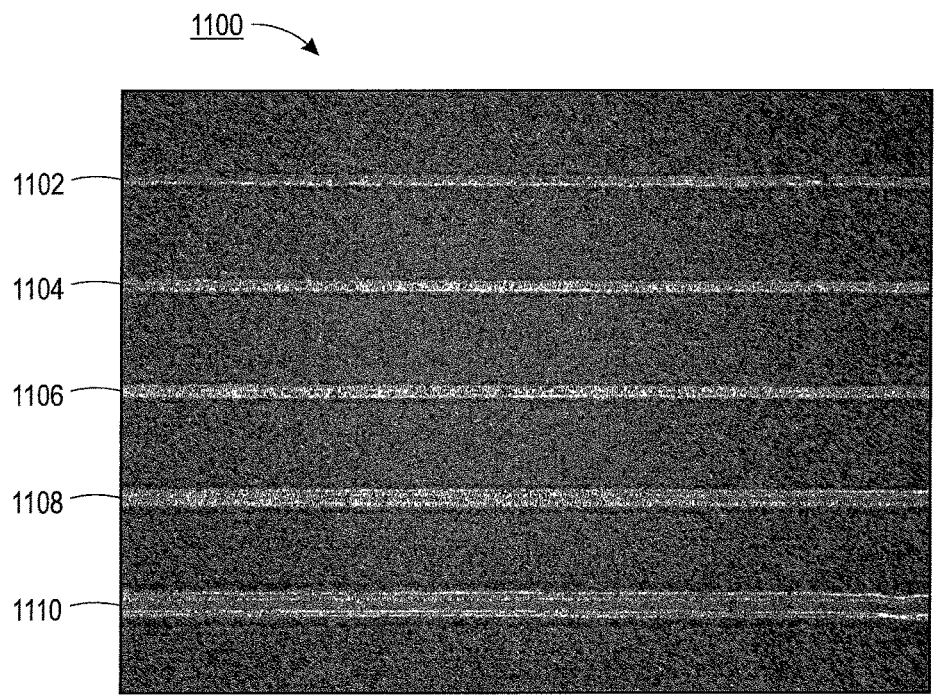
FIG. 11 shows lines printed with an optical adhesive at various translation speeds for a material deposition system according to the present teachings.

Turning to FIG. 11, illustrated is a chart 1100 of deposited traces 1102, 1104, 1106, 1108, 1110. The thicknesses of the deposited traces shown to increase 1102 through 1110, corresponding to the longer time taken to deposit the material.

Figure 12:
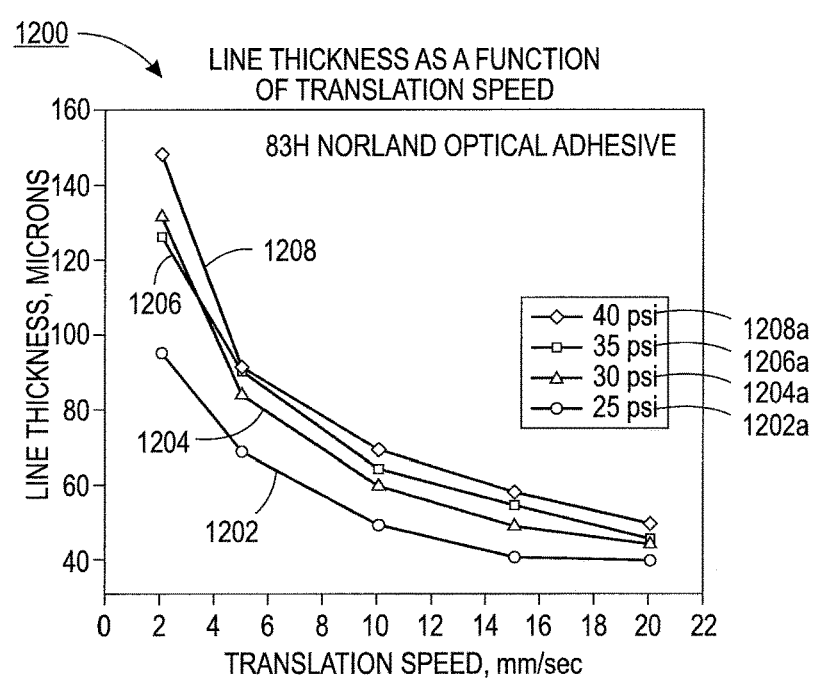
FIG. 12 is a plot of line thickness as a function of the translational speed for a variety of deposited traces or lines.

Turning to FIG. 12, illustrated is a chart 1200 which identifies four line thicknesses (1202, 1204, 1206, and 1208) as a function of translation speed and for an amount of air pressure supplied, i.e., 1202a is 25 psi, 1204a is 30 psi, 1206a is 35 psi, and 1208a is 40 psi). The material used to generate the traces or lines of FIG. 12 included a 83H Norland Optical Adhesive.

The foregoing has thus described systems (e.g., 100, 500) where a rollerball (e.g., 200) is rotatably mounted in a housing component 202 which is part of a material deposition assembly 110, which is a spring-loaded type assembly. The housing component 202 is a low mass housing (e.g., in certain embodiments between 1.5 to 2.0 g), and is the only part of the housing component 202 which engages the bias mechanism (e.g., spring) 216. This allows the rollerball 200 to roll over a surface having raised features or portions (e.g., 104b, 104c) with low force (e.g., 0.05-0.20 lbf in a particular embodiment using a spring as the bias mechanism).

It has also been described that the material (at times called an ink) 112a is fed to the material deposition assembly 110 from a pressurized material container or reservoir through a flexible tube arrangement (e.g., 224, 226, 228).

On printed electronic circuits it is often necessary to print conductive cross-overs of printed traces, including an intervening dielectric layer. Use of the disclosed systems (e.g., 100, 500) simplify this operation by eliminating the need for a feedback system to maintain an ejector a distance from the substrate required for existing non-contact extrusion and inkjet printing systems.

The disclosed systems (e.g., 100, 500) are also used to deposit or print contact lines to surface mount discrete components and to print on other 3-dimensional features.

The characteristics of the deposited or printed trace (or line) are at least in part dependent on the rollerball diameter, the material being deposited, as well as the substrate properties (e.g., such as but not limited to surface energy). A material of a suitable viscosity and surface tension is used, where the specific viscosity and surface tension of the selected material will depend on the particular implementation, and is chosen such that the material does not leak from the assembly 110 when stationary.

It is considered in certain embodiments that a 700 micron diameter ball is used, while in other embodiments the rollerball is in a range having a diameter from about 200 microns to 1 millimeter.

At the point between a flat surface and the incident slope (or angle) of a raised feature or portion there may or will be a region (or gap area) which is not accessible to the rollerball (see FIGS. 7-10). The size of this region depends in part on the diameter of the rollerball and/or the size of the housing component holding the rollerball.

The properties of the material (e.g., surface tension and viscosity) will determine how well this region is filled. Also, the rollerball diameter is a factor in a determination of the distance between the point at which the ball makes contact with the printing surface and the housing. This in turn, determines the maximum slope or angle that the rollerball can engage without the housing interfering as discussed in connection with FIGS. 7-10.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A material deposition system for depositing a material onto surfaces on a substrate, the system comprising:
   a material deposition assembly including,
   a rollerball,
   a controller,
   a housing component configured to hold the rollerball, the housing component having an inner surface, an outer surface, a first end, and a second end distant from the first end, the first end sized and configured to hold the rollerball while allowing the rollerball to rotate,
   a bias mechanism positioned to contact the second end of the housing component, said bias mechanism is configured to allow the housing component to move in a vertical direction;
   a stationary fitting having an inner surface and outer surface, the inner surface in contact with at least a portion of the outer surface of the housing component,
   a material carrying tube arrangement arranged to carry the material to be deposited, the material carrying tube arrangement having a first opening arranged to receive the material to be deposited on the surface of the substrate, including raised surfaces, and a second end positioned adjacent a portion of the rollerball;
   a body portion configured to enclose at least the movable housing component and the stationary fitting;
   a material container configured to hold the material to be deposited, and positioned to provide the material to be deposited to the material carrying tube arrangement;
   a carriage configured to hold and move the material deposition assembly; and
   a raised feature sensor positioned and configured to sense a presence of a raised feature on the surface of the substrate on which material is being deposited, and to send a control signal to the controller, wherein said controller is configured to control output of the material to be deposited while the rollerball is in contact with the surface of the substrate;
   said system is configured to allow the rollerball to maintain contact with the surface of the substrate as the system traverses the raised feature and a planar portion of the surface of the substrate allowing for formation of an unbroken line of the material to be deposited over the surface of the substrate.

2. The system according to claim 1 wherein the inner surface of the stationary fitting has a coefficient of friction to allow sliding of the outer surface of the housing component against the inner surface of the stationary fitting.

3. The system according to claim 1 further including an air pressure generator positioned and configured to generate air pressure to move the material to be deposited through the material carrying tube configuration and out over the rollerball.

4. The system according to claim 1 wherein the bias mechanism comes into contact with the housing component only at the second end of the housing component.

5. The system according to claim 1 further including a surface location indicator configured to determine a distance between the material deposition assembly and the surface of the substrate on which the rollerball is to contact and the material is to be deposited.

6. The system according to claim 1 wherein the stationary fitting is made of a substance having a coefficient of friction of between 0.1 and 0.2.

7. The system according to claim 1 wherein the stationary fitting is made of at least one of a low surface energy polymer and a graphalloy.

8. The system according to claim 1 wherein the material is a non-Newtonian fluid which is maintained within the material deposition assembly until movement of the rollerball which causes a shear stress which lowers the viscosity of the material permitting the material to flow.

9. The system according to claim 3 wherein the air pressure generator provides air pressure in a range of 20 psi to 40 psi.

10. The system according to claim 1 wherein the material deposition is configured to deposit material from the rollerball end over printed electronics as part of 3D printing.

11. The system according to claim 1 wherein the bias mechanism includes one of a spring, compressed gas, and memory foam material.

12. A material deposition system for depositing a material onto raised surfaces on a substrate, the system comprising:
   a material deposition assembly including,
   a rollerball,
   a housing component configured to hold the rollerball, the housing component having an inner surface, an outer surface, a first end, and a second end distant from the first end, the first end sized and configured to hold the rollerball while allowing the rollerball to rotate,
   a bias mechanism positioned to contact the second end of the housing component, said bias mechanism is configured to allow the housing component to move in a vertical direction;
   a stationary fitting having an inner surface and outer surface, the inner surface in contact with at least a portion of the outer surface of the housing component,
   a material carrying tube arrangement arranged to carry the material to be deposited, the material carrying tube arrangement having a first opening arranged to receive the material to be deposited on the surface of the substrate, and a second end positioned adjacent a portion of the rollerball;

a material container configured to hold the material to be deposited, and positioned to provide the material to be deposited to the material carrying tube arrangement;

a carriage configured to hold and move the material deposition assembly; and a raised feature sensor having a feedback line to a controller wherein the raised feature sensor is configured to send control signals and wherein the raised feature sensor operates while the rollerball is in contact with the surface;

wherein said controller is configured to control output of the material to be deposited, while the rollerball is in contact with the surface; said system is configured to allow the rollerball to maintain contact with the surface of the substrate as the system traverses the raised feature and a planar portion of the surface of the substrate allowing for formation of an unbroken line of the material to be deposited over the surfaces of the substrate.

13. The system according to claim 12 wherein the bias mechanism includes one of a spring, compressed gas, and memory foam material.

14. The system according to claim 12 wherein the controller is configured to increase the material coming from the rollerball when the rollerball is in an area of an inclined slope.

15. The system according to claim 12 wherein the inner surface of the stationary fitting has a coefficient of friction to allow sliding of the outer surface of the housing component against the inner surface of the stationary fitting.

16. The system according to claim 12 further including an air pressure generator positioned and configured to generate air pressure to move the material to be deposited through the material carrying tube configuration and out over the rollerball.

17. The system according to claim 16 wherein the stationary fitting is made of at least one of a low surface energy polymer and a graphalloy.

18. The system according to claim 1 wherein the material deposition is configured to deposit material from the rollerball end over printed electronics as part of 3D printing.

* * * * *